(12) United States Patent
Zhang et al.

(10) Patent No.: US 11,557,353 B2
(45) Date of Patent: Jan. 17, 2023

(54) OPTIMAL DETECTION VOLTAGE OBTAINING METHOD, READING CONTROL METHOD AND APPARATUS OF MEMORY

(71) Applicant: MAXIO Technology (Hangzhou) Co., Ltd., Hangzhou Zhejiang (CN)

(72) Inventors: Xuhang Zhang, Hangzhou Zhejiang (CN); Xiaofan Yu, Hangzhou Zhejiang (CN); Zihua Xiao, Hangzhou Zhejiang (CN); Ye Jin, Hangzhou Zhejiang (CN); Quan Cai, Hangzhou Zhejiang (CN); Xiaomin Luo, Hangzhou Zhejiang (CN); Lihong Zhao, Hangzhou Zhejiang (CN); Rui Cao, Hangzhou Zhejiang (CN)

(73) Assignee: MAXIO TECHNOLOGY (HANGZHOU) CO., LTD., Hangzhou Zhejiang (CN)

( * ) Notice: Subject to any disclaimer, the term of this patent is extended or adjusted under 35 U.S.C. 154(b) by 0 days.

(21) Appl. No.: 17/546,242

(22) Filed: Dec. 9, 2021

(65) Prior Publication Data
US 2022/0189560 A1    Jun. 16, 2022

(30) Foreign Application Priority Data

Dec. 15, 2020 (CN) .......................... 202011479904.9

(51) Int. Cl.
*H03M 13/00* (2006.01)
*G11C 16/26* (2006.01)
(Continued)

(52) U.S. Cl.
CPC .......... *G11C 16/26* (2013.01); *H03M 13/1108* (2013.01); *H03M 13/1111* (2013.01); *G11C 16/0483* (2013.01)

(58) Field of Classification Search
CPC .......... H03M 13/1111; H03M 13/1108; H03M 13/3927; H03M 13/45; H03M 13/116;
(Continued)

(56) References Cited

U.S. PATENT DOCUMENTS

| 7,893,857 B2* | 2/2011 | Kim ..................... H03K 5/2481 |
| | | 341/172 |
| 8,910,011 B2* | 12/2014 | Park .................. H03M 13/6583 |
| | | 714/752 |

(Continued)

FOREIGN PATENT DOCUMENTS

CN        113223593 A    8/2021

*Primary Examiner* — Esaw T Abraham
(74) *Attorney, Agent, or Firm* — Westman, Champlin & Koehler, P.A.

(57) ABSTRACT

An optimal detection voltage obtaining method, a reading control method and an apparatus are provided. The method includes: obtain a plurality of first difference values and a plurality of second difference values, the second difference value characterizes a difference value of two detection voltages which are adjacent in numerical value, the first difference value characterizes a difference between numbers of memory cells whose threshold voltages respectively equal to the two detection voltages used by the second difference value; dividing the first difference by the second difference to obtain a plurality of tangent approximations; selecting a first tangent approximation and a second tangent approximation from the plurality of tangent approximations, the first tangent approximation is a positive number and the second tangent approximation is a negative number; calculating an optimal detection voltage according to the first tangent approximation, the second tangent approximation, a first detection voltage and a second detection voltage.

17 Claims, 6 Drawing Sheets

(51) Int. Cl.
*H03M 13/11* (2006.01)
*G11C 16/04* (2006.01)

(58) Field of Classification Search
CPC ............ H03M 13/1105; H03M 13/09; H03M 13/2927; H03M 13/4138; G11C 16/26; G11C 29/028; G11C 29/021; G11C 11/5642; G11C 2029/5004; G11C 5/147
See application file for complete search history.

(56) References Cited

U.S. PATENT DOCUMENTS

| | | | |
|---|---|---|---|
| 9,053,804 B2* | 6/2015 | Wu | G11C 11/5642 |
| 9,235,467 B2* | 1/2016 | Micheloni | G06F 11/1012 |
| 9,582,361 B2* | 2/2017 | Wu | G06F 11/10 |
| 9,778,979 B2* | 10/2017 | Shin | H03M 13/114 |
| 10,120,585 B2* | 11/2018 | Xiong | G11C 29/026 |
| 10,417,087 B2* | 9/2019 | Lu | H03M 13/2951 |
| 10,498,363 B2* | 12/2019 | Kim | H03M 13/1108 |
| 10,725,486 B2* | 7/2020 | Fang | H03K 5/24 |

* cited by examiner

OPTIMAL DETECTION VOLTAGE OBTAINING METHOD, READING CONTROL METHOD AND APPARATUS OF MEMORY

CROSS-REFERENCE TO RELATED APPLICATION

This application claims priority to the Chinese Patent Application No. 202011479904.9, filed on Dec. 15, 2020 and entitled "optimal detection voltage obtaining method, reading control method and apparatus of memory", which are incorporated herein by reference in its entirety in this disclosure.

BACKGROUND OF THE DISCLOSURE

Field of Technology

The present disclosure relates to the technical field of memories, in particular to an optimal detection voltage obtaining method, a reading control method and an apparatus of a memory.

Description of the Related Art

As a non-volatile memory, an NAND flash memory is widely used in wireless communication, conventional hard disk, solid state memory hard disk, and other products.

When reading data from the NAND flash memory, a decoder is required to decode a read data to obtain data content. During the decoder performs decoding using a soft decoding algorithm, an Error Correction Code (ECC) is usually used to correct a certain number of erroneous data bits. In an existing ECC error correction technology, the ECC error correction may be implemented using a BCH code (that is, Bose-Chaudhuri-Hocquenghem code) or an LDPC code (that is, Low Density Parity Check code). The error correction capability of the LDPC code is superior to that of the BCH code. With reduction of a process and increase of a number of stacked layers of the 3D NAND flash memory, an original Bit Error Rate (RBER) in a read operation is increasing continuously, and the BCH code cannot meet current demand In recent years, LDPC codes have been widely used in NAND flash memories instead of BCH codes.

A decoding method of the LDPC code includes following three types: hard decision decoding, soft decision decoding, and hybrid decoding. The hard decision means that a demodulator directly decides a received signal waveform according to a decision threshold and outputs 0 or 1. In the soft decision, the demodulator does not make a decision, and directly outputs analog quantity, or an output waveform of the demodulator is subjected to multilevel quantization and then sent to a decoder, namely, the output waveform of a decoding channel is 'soft information' which is not subjected to decision, and the decoder makes a decision on the 'soft information'. The hybrid decoding is a combination of both.

Different decoding methods may be adopted for the same LDPC code to obtain different error correction performances. In comparison, the hard decision decoding is faster and more efficient, and the soft decision decoding has more excellent decoding capability. Therefore, the two are usually combined to exert a maximum effectiveness, that is, the hard decision decoding is adopted first, and then data which cannot be distinguished by the hard decision decoding is judged by the soft decision. Therefore, to make the decoding capability of soft decision decoding highly effective, the result of hard decision decoding needs to be more accurate, and to achieve a result of hard decision decoding more accurate, a more accurate optimal detection voltage (Vopt) needs to be provided.

SUMMARY

In view of the above, the present disclosure provides an optimal detection voltage obtaining method, a reading control method and an apparatus of a memory, wherein the optimal detection voltage obtaining method of the memory is capable of acquisition an optimal detection voltage of the memory.

According to a first aspect of the present disclosure, an optimal detection voltage obtaining method of memory is provided and comprising:

performing a plurality of read operations at a plurality of detection voltages to obtain a plurality of first difference values and a plurality of second difference values, wherein the second difference value characterizes a difference value of two detection voltages which are adjacent in numerical value, and the first difference value characterizes a difference between numbers of memory cells whose threshold voltages respectively equal to the two detection voltages used by the second difference value;

dividing the first difference by the second difference to obtain a plurality of tangent approximations;

selecting a first tangent approximation and a second tangent approximation from the plurality of tangent approximations, the first tangent approximation is a positive number and the second tangent approximation is a negative number;

calculating an optimal detection voltage according to the first tangent approximation, the second tangent approximation, a first detection voltage corresponding to the first tangent approximation and a second detection voltage corresponding to the second tangent approximation.

Optionally, the calculating an optimal detection voltage according to the first tangent approximation, the second tangent approximation, a first detection voltage corresponding to the first tangent approximation and a second detection voltage corresponding to the second tangent approximation comprises:

taking the second tangent approximation as a weight coefficient of the first detection voltage corresponding to the first tangent approximation, and taking the first tangent approximation as a weight coefficient of the second detection voltage corresponding to the second tangent approximation to perform weighting calculation, to obtain the optimal detection voltage.

Optionally, a step of obtaining the plurality of detection voltages is one of:

increasing a first step length step by step on a basis of a first voltage initial value to obtain the plurality of detection voltages;

reducing a second step length step by step on a basis of a second voltage initial value to obtain the plurality of detection voltages;

increasing or decreasing a third step length step by step on a basis of a third voltage initial value to obtain the plurality of detection voltages.

Optionally, the third voltage initial value is a default detection voltage of the memory.

Optionally, an absolute value of the first tangent approximation is equal to an absolute value of the second tangent approximation.

Optionally, further comprising: obtaining a plurality of voltage values corresponding to a plurality of peaks of threshold voltage distribution of the memory in an ideal condition; and taking a voltage value corresponding to the peak as the first initial voltage value or the second initial voltage value.

Optionally, when the memory is a multi-level cell, the optimal detection voltage obtaining method further comprises: obtaining a plurality of optimal detection voltages by repeatedly executing respective steps of the optimal detection voltage obtaining method.

Optionally, the first tangent approximation is a minimum value of positive tangent approximations, and the second tangent value is a minimum value of absolute values of negative tangent approximations.

According to a second aspect of the present disclosure, a read control method of a memory is provided and comprising:

obtaining the optimal detection voltage by using the optimal detection voltage obtaining method according to any one of claims 1 to 8;

performing hard decision decoding of LDPC under the optimal detection voltage to obtain first data;

performing soft decision decoding on the first data to obtain second data;

performing LDPC decoding on the second data to obtain final output data.

According to a third aspect of the present disclosure, a read control apparatus of a memory is provided and comprising:

a hard decoding block for performing hard decision decoding of LDPC under the optimal detection voltage to obtain first data;

a soft decoding block for performing soft decision decoding on the first data to obtain second data;

an LDPC decoder block for performing LDPC decoding on the second data to obtain final output data, wherein an optimal detection voltage obtaining method comprises following steps:

performing a plurality of read operations at a plurality of detection voltages to obtain a plurality of first difference values and a plurality of second difference values, wherein the second difference value characterizes a difference value of two detection voltages which are adjacent in numerical value, and the first difference value characterizes a difference between numbers of memory cells whose threshold voltages respectively equal to the two detection voltages used by the second difference value;

dividing the first difference by the second difference to obtain a plurality of tangent approximations;

selecting a first tangent approximation and a second tangent approximation from the plurality of tangent approximations, the first tangent approximation is a positive number and the second tangent approximation is a negative number;

calculating an optimal detection voltage according to the first tangent approximation, the second tangent approximation, a first detection voltage corresponding to the first tangent approximation and a second detection voltage corresponding to the second tangent approximation.

Optionally, the calculating an optimal detection voltage according to the first tangent approximation, the second tangent approximation, a first detection voltage corresponding to the first tangent approximation and a second detection voltage corresponding to the second tangent approximation comprises:

taking the second tangent approximation as a weight coefficient of the first detection voltage corresponding to the first tangent approximation, and taking the first tangent approximation as a weight coefficient of the second detection voltage corresponding to the second tangent approximation to perform weighting calculation, to obtain the optimal detection voltage.

Optionally, a step of obtaining the plurality of detection voltages is one of:

increasing a first step length step by step on a basis of a first voltage initial value to obtain the plurality of detection voltages;

reducing a second step length step by step on a basis of a second voltage initial value to obtain the plurality of detection voltages;

increasing or decreasing a third step length step by step on a basis of a third voltage initial value to obtain the plurality of detection voltages.

Optionally, the third voltage initial value is a default detection voltage of the memory.

Optionally, an absolute value of the first tangent approximation is equal to an absolute value of the second tangent approximation.

Optionally, a step of obtaining the first initial voltage value and second initial voltage value comprises: obtaining a plurality of voltage values corresponding to a plurality of peaks of threshold voltage distribution of the memory in an ideal condition; and taking a voltage value corresponding to the peak as the first initial voltage value or the second initial voltage value.

Optionally, the first tangent approximation is a minimum value of positive tangent approximations, and the second tangent value is a minimum value of absolute values of negative tangent approximations.

Optionally, the memory is a flash memory.

According to a fourth aspect of the present disclosure, a memory controller is provided and comprising the above read control apparatus and a write control apparatus.

According to a fifth aspect of the present disclosure, a flash memory system is provided and comprising a memory and the above memory controller.

According to the reading control method provided by the embodiment of the disclosure, the plurality of tangent approximations of the plurality of inclination angles of the threshold voltage curve of the plurality of the detection voltages are approximately calculated, and two tangent approximations with opposite positive and negative are selected from the tangent approximations. Due to curve characteristics based on the threshold voltage curve, the detection voltage corresponding to the two tangent approximations should be located on both sides of the optimal detection voltage. The optimal detection voltage obtained by calculation is used in the hard decision decoding, so that an original bit error rate can be reduced, decoding effects of soft decision decoding and LDPC decoding are improved, reading speed is improved, and system power consumption is reduced.

BRIEF DESCRIPTION OF THE DRAWINGS

Through the following description of the embodiments of the present disclosure with reference to the accompanying drawings, the above and other objectives, features, and advantages of the present disclosure will be more apparent, in the accompanying drawings.

DETAILED DESCRIPTION OF THE DISCLOSURE

Figure 1:
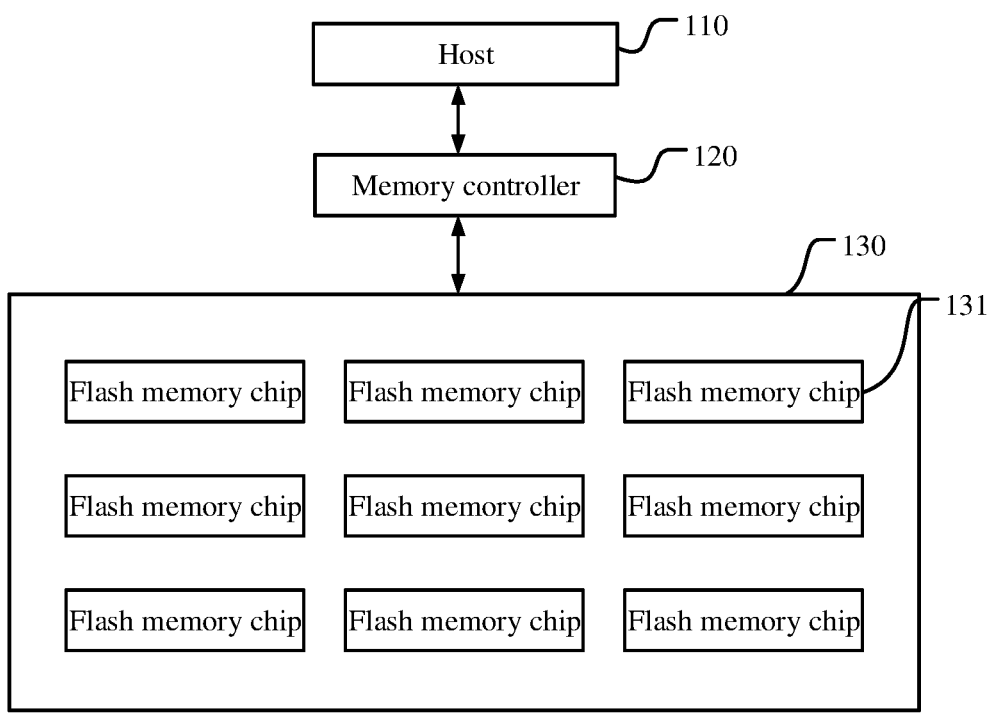
FIG. 1 shows a schematic block diagram of a flash memory system.

The present disclosure will be described below based on examples, but the present disclosure is not limited to these examples. In the following detailed description of the present disclosure, some specific details are described in detail. Those skilled in the art can fully understand the present disclosure without the description of these details. In order to avoid obscuring the essence of the present disclosure, the well-known methods, processes, and procedures are not described in detail. In addition, the drawings are not necessarily drawn to scale.

The flowcharts and block diagrams in the drawings illustrate possible system frameworks, functions, and operations of the systems, methods, and apparatuses of the embodiments of the present disclosure, the blocks on flowcharts and block diagrams can characterize a block, program segment or just a piece of code, the blocks, program segments, and codes are all executable instructions used to implement prescribed logic functions. It should also be noted that the executable instructions that implement the prescribed logic functions can be recombined to generate new blocks and program segments. Therefore, the blocks and the sequence of the blocks in the drawings are only used to better illustrate the process and steps of the embodiment, and should not be used as a limitation to the disclosure itself.

The present disclosure uses following terminologies.

Original Bit Error Rate (RBER), which is a Raw Bit Error Rate before ECC is used, reflects a most primitive reliability state of an NAND Flash. The higher the original error rate, the worse the NAND Flash reliability.

ECC is a shorthand for "Error Correcting Code," which is a technology that enables error checking and correction. LDPC (Low Density Parity Check code) and BCH (Bose-Chaudhuri-Hocquenghem code) are two branches of ECC techniques.

FIG. 1 shows a schematic block diagram of a flash memory system. The flash memory system is, for example, a computer system using a solid state disk (SSD). The computer system includes a host 110. The solid state disk includes a memory controller 120 and a memory 130. The host 110 accesses the memory 130 via the memory controller 120. The memory 130 includes at least one flash memory chip 131. In the flash memory system, storage data is encoded data generated by encoding original data, and the original data can be obtained only by decoding the storage data in a reading process.

The host 110 includes, for example, a processor. In a use state, the processor loads programs or reads data from the memory 130, and writes data to the memory 130.

The memory controller 120 is, for example, a separate integrated circuit chip including a writing control apparatus and a reading control apparatus. During a write operation, the writing control apparatus performs LDPC encoding on the original data to generate the storage data, thereby writing the storage data into the memory 130. During a read operation, the reading control apparatus obtains the storage data from the memory 130 and then performs LDPC decoding based on log-likelihood ratio (LLR) to obtain the original data.

The flash memory chip 131 includes a plurality of memory cells. In an example, each memory cell may be a single-level cell (SLC) that stores a single bit of data. In another example, each memory cell may be a multi-level cell (MLC), which stores a plurality of bits of data.

In the present embodiment, the computer system using the solid state disk is taken as an example of the flash memory system. However, the present disclosure is not limited thereto. The flash memory system can be any one of the solid state disk, a memory bank, a flash disk and a flash memory card.

Figure 2:
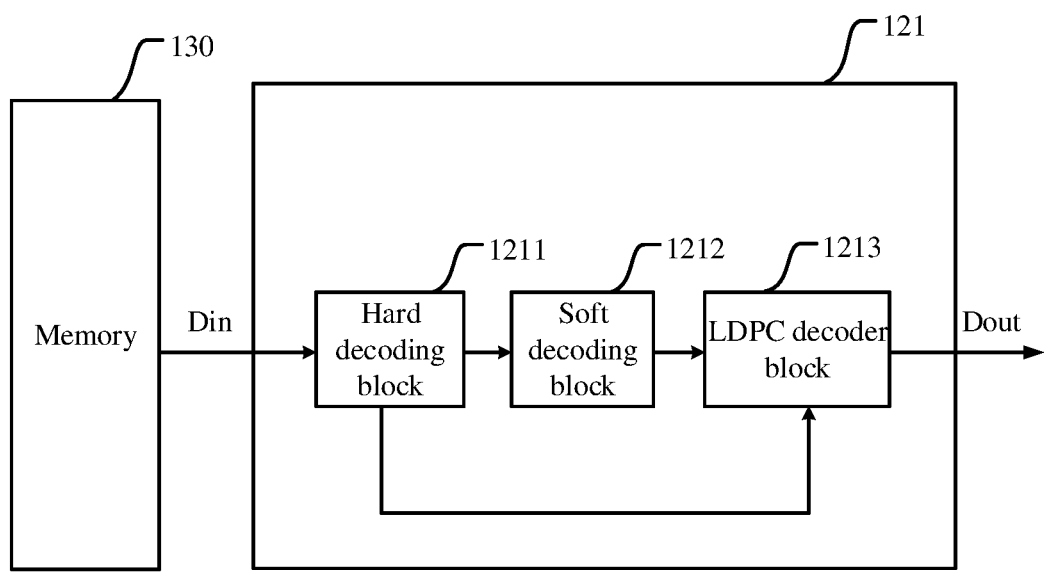
FIG. 2 shows a schematic block diagram of a reading control apparatus in a flash memory system.

FIG. 2 shows a schematic block diagram of the reading control apparatus in the flash memory system. As described above, the memory controller in the flash memory system includes the writing control apparatus and the reading control apparatus. Embodiment of the present disclosure relates generally to variations of the reading control apparatus.

The reading control apparatus 121 comprises a hard decoding block 1211, a soft decoding block 1212 and an LDPC decoder block 1213.

In operation, the hard decoding block 1211 reads data from the memory 130 in units of memory pages and then performs a decoding operation on a read data using hard decision decoding. Specifically, in a read cycle, the hard decoding block 1211 applies a detection voltage (detection voltage) to each memory cell of the memory page. For a given memory cell, the hard decode block 1211 determines whether a threshold voltage of the memory cell is higher or lower than the applied detection voltage. Based on this determination, for example, if the memory cell is the SLC, the hard decoding block 1211 estimates whether a bit stored in the memory cell is '0' or '1'. If the memory cell is an MLC, a plurality of detection voltages is applied in a plurality of passes to calculate the bits stored in the memory cell. The memory cell is formed by a Metal-Oxide-Semiconductor (MOS) transistor with a floating gate, and the hard decoding block 1211 determines binary data stored in the transistor according to a level state in the transistor after applying the detection voltage to the memory cell (actually, applying the detection voltage to a control gate of the transistor). For example, the memory cell a can store 3 bits of data, that is, binary data of 000,001,010,011,100,101,110, 111 can be stored, and when the data is written into the memory cell A, a number of electric charges in the memory cell A is changed to change the threshold voltage of the memory cell A, for example, when '111' is written, the corresponding threshold voltage is Vth1, so that the above-mentioned 8 binary data corresponds to the 8 threshold voltages, and when data is read, based on comparison result of the detection voltage applied to the memory cell A and the 8 threshold voltages, it can be determined which of the above-mentioned 8 binary data the binary data stored in the memory cell A is. The read operation is thus associated with one or more detection voltages that are applied to the memory cells of a memory page of memory 130 during reading.

The Raw Bit Error Rate (RBER) refers to a percentage of error bit data to all bit data in bit data read by the hard decoding block 1211. If the raw bit error rate is low, a hard decision information may be provided directly to LDPC decoder block 1213. If the raw bit error rate is high, the hard decision information may be provided to the soft decoding block 1212. The LDPC decoder block 1213 performs a decoding operation using an iterative soft decoding technique, thereby generating output data Dout, which is the original data characterized by storage data Din. For example, the LDPC decoder block 1213 performs an iterative soft decoding operation of ECC decoding on the data using a Low Density Parity Check (LDPC) code. The LDPC decoder block 1213 performs decoding by combining soft decision result of the soft decoding block 1212 during decoding process.

The Raw Bit Error Rate (RBER) refers to a percentage of error bit data to all bit data in the bit data read by the hard decoding block 1211. If the raw bit error rate is low, the hard decision information may be provided directly to LDPC decoder block 1213. If the original bit error rate is high, the hard decision information needs to be provided to the soft decoding block 1212 for soft decoding. The soft decoding block 1212 provides soft decisions for erroneous data in the hard decision information. The soft decoding block 1212 may perform a plurality of read operations under a plurality of detection voltages to obtain a plurality of sets of different data, then perform a plurality of iterative operations on the data in combination with a Log-likelihood Ratio (Log-likelihood Ratio), and analyze how large the probability of each bit data being 0 or 1 is according to information of the Log-likelihood Ratio, where such probability information is referred to as soft information, and finally perform soft decision based on the soft information to provide a more accurate and more realistic error correction effect. The LDPC decoder block 1213 iteratively performs a decoding operation using an LDPC coding technique, thereby generating output data Dout, which is the original data characterized by the storage data Din. For example, the LDPC decoder block 1213 performs an iterative soft decoding operation of ECC decoding on the data using a Low Density Parity Check (LDPC) code. The LDPC decoder block 1213 performs decoding by combining soft decision result of the soft decoding block 1212 during the decoding process.

Ideally, most of the error bits are corrected successfully by the above blocks, and an actual result of the read operation is not affected. However, as an use time of the flash memory product increases, the number of the electric charge of each memory cell changes due to accidental electrical noise, environmental conditions, aging of the memory, and other factors, and further the threshold voltage of each memory cell also changes, and this change affects decision capability of the hard decoding block 1211 on the data in each memory cell, which leads to an increase in the original bit error rate, and further affects an output result of the subsequent blocks.

Figure 3:
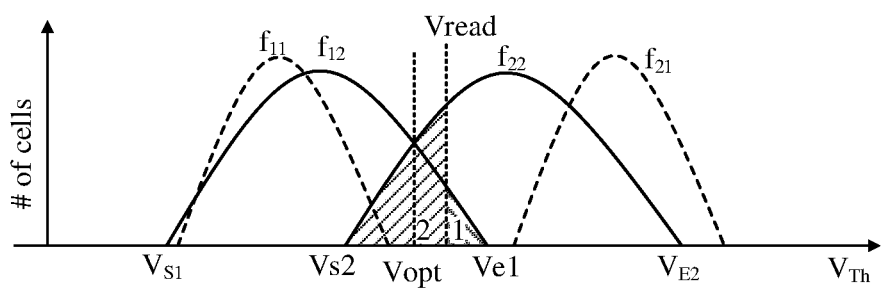
FIG. 3 is a threshold voltage distribution diagram of flash memory of an embodiment of the present disclosure.

FIG. 3 is a graph of threshold voltage distribution for an exemplary flash memory, with threshold voltage on the horizontal axis and a number of the memory cells on the vertical axis. The memory cells of the memory are set to the SLC. The SLC only stores '0' or '1', so there are only two normal threshold voltage distributions on the graph. Regions surrounded by dotted lines f11 and f21 in FIG. 3 characterize threshold voltage distributions before the number of the electric charge changes, respectively. When the hard decoding block 1211 performs data read on the flash memory, the detection voltage Vread is applied to each memory cell. It is obvious that the detection voltage Vread is greater than the threshold voltage of the memory cell corresponding to f11, and the detection voltage Vread is less than the threshold voltage of the memory cell corresponding to f21, so that if the data stored in the memory cell corresponding to f11 is '1', the data stored in the memory cell corresponding to f21 is '0'. Therefore, data in the memory cell to be read can be easily distinguished before the number of electric charges in each memory cell changes.

However, as the number of the electric charges in each memory cell changes, the threshold voltage of each memory cell also changes. Solid line f12 and f22 in FIG. 3 show threshold voltage distributions after the number of the electric charges has changed, respectively. The f12 and f22 in FIG. 3 shift and broaden relative to morphology of f11 and f21, respectively. An overlapping region of two states occurs near Vread. When the detection voltage Vread is applied to each memory cell to read data, the memory cell of the 2 region itself storing the bit '0' is erroneously determined as the bit '1' and the memory cell of the 1 region storing the bit '1' is erroneously determined as the bit '0' according to the previous assumption. Meanwhile, the memory cells with the threshold voltage just equal to Vread cannot be correctly distinguished, so half of this part of the memory cells can be misjudged. The number of the memory cells in the two regions, plus half the number of the memory cells with a threshold voltage equal to Vread, is the number of faulty memory cells in the current read operation.

A ratio of a number of errors to the read data size (Raw Bit Error Rate, RBER) is usually counted to reflect an error level, and a calculation formula (1) of RBER is summarized as follows:

$$RBER = \frac{\int_{V_{s2}}^{V_{read}} f_2 + \int_{V_{read}}^{V_{e1}} f_1 + \frac{1}{2}[f_1(Vread) + f_2(Vread)]}{page_{size}(\text{bit})} \quad \text{formula (1)}$$

Combining formula (1) with FIG. 3, it can be easily seen that a size of RBER depends on a sum of areas of region 2 and region 1. That is, when the sum of both is smaller, the resulting RBER is smaller, a data amount of error bit data is minimum, and thus Vopt on the graph is an optimal detection voltage.

Figure 4:
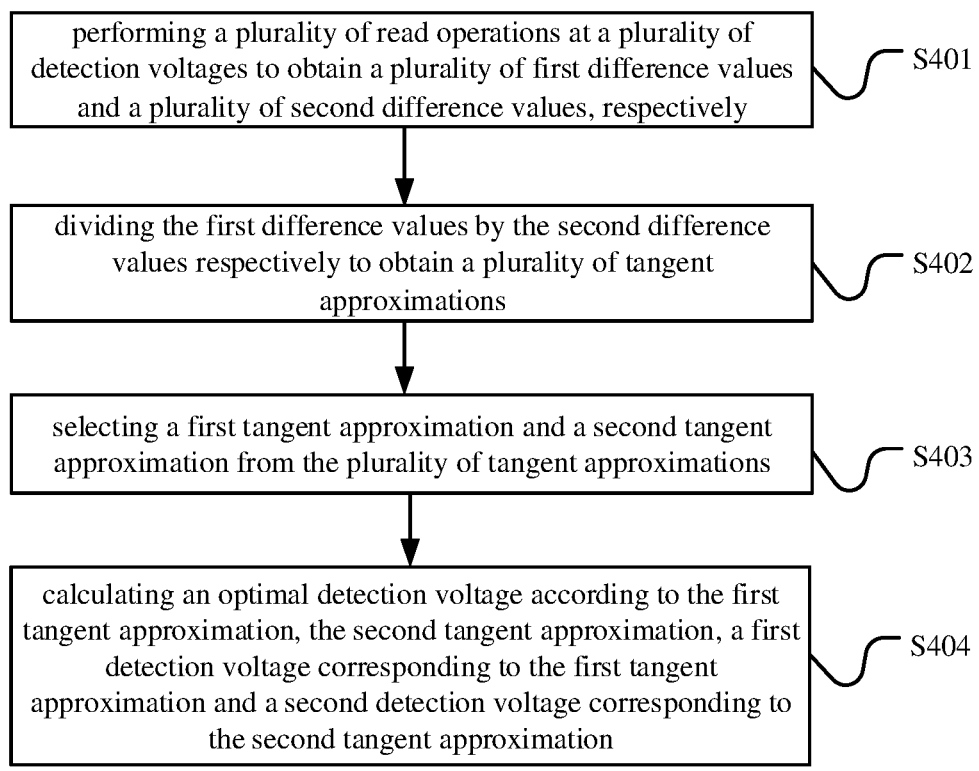
FIG. 4 is a flowchart of an optimal detection voltage obtaining method of a memory according to an embodiment of the disclosure.

A purpose of the present disclosure is to provide an optimal detection voltage obtaining method of a memory, which comprises following steps as shown in FIG. 4:

In step S401, performing a plurality of read operations at a plurality of detection voltages to obtain a plurality of first difference values and a plurality of second difference values, respectively. The plurality of detection voltages increases sequentially, the second difference value characterizes a difference between two adjacent detection voltages, and the first difference value characterizes a difference between the numbers of the memory cells whose threshold voltages respectively equal to the two detection voltages used by the second difference.

In step S402, dividing the first difference values by the second difference values respectively to obtain a plurality of tangent approximations.

In step S403, selecting a first tangent approximation and a second tangent approximation from the plurality of tangent approximations, where the first tangent approximation is a positive number and the second tangent approximation is a negative number.

In step S404, calculating an optimal detection voltage according to the first tangent approximation, the second tangent approximation, a first detection voltage corresponding to the first tangent approximation and a second detection voltage corresponding to the second tangent approximation.

Figure 5:
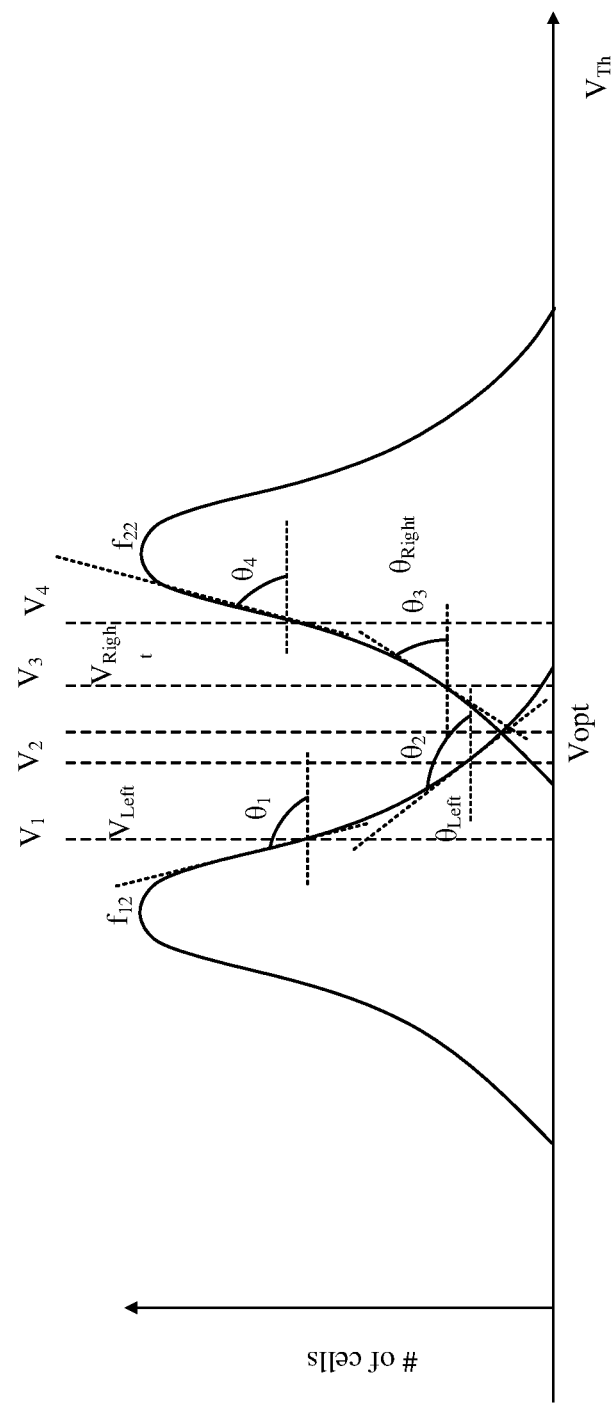
FIGS. 5 and 6 are threshold voltage distribution diagrams for two exemplary flash memories.
Figure 6:
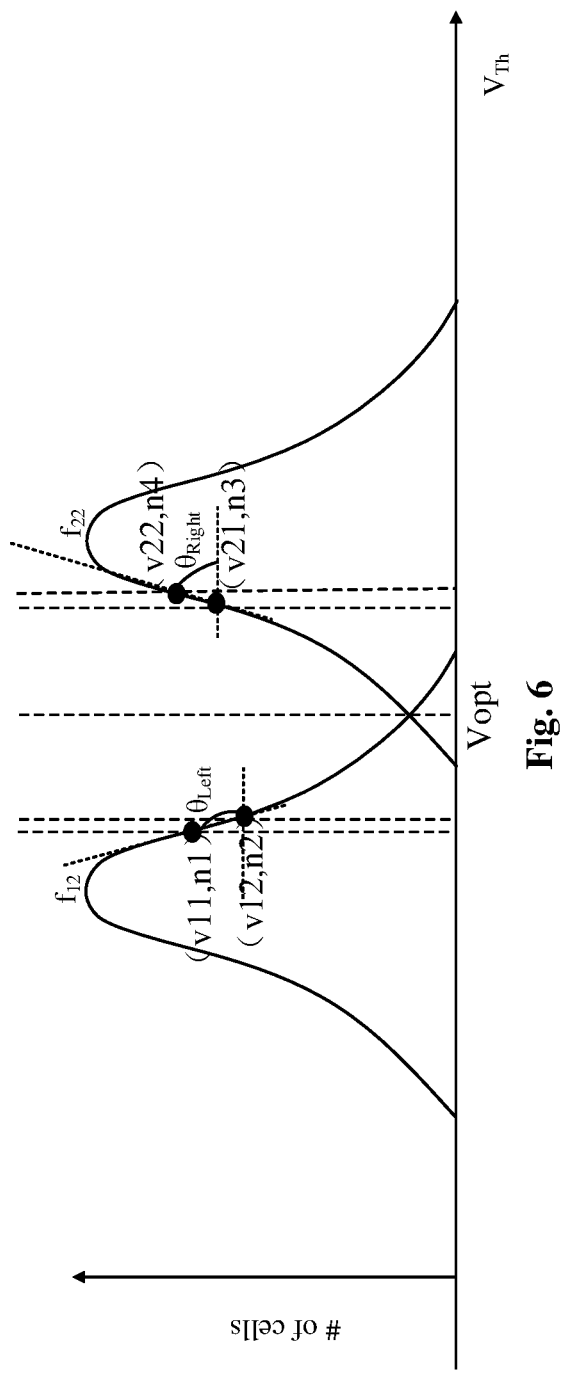

FIGS. 5 and 6 are threshold voltage distribution diagrams for two exemplary flash memories. Core idea of the disclosure is explained below refer to FIG. 5. As shown in the figure, solid lines f12 and f22 show normal threshold voltage distributions after the number of electric charges has changed. V1, V2, V3 and V4 are detection voltages applied to the memory cells to read data. As shown in the figure, inclination angles of V1, V2, V3, and V4 with normal distribution curve are θ1, θ2, θ3 and θ4. As can be seen from the figure, θ1 and θ2 are equal to or greater than 90° and less than 180°, and θ3 and θ4 are less than 90°. Vopt is located between V2 and V3. Therefore, a larger inclination angle θ2 (corresponding to a smaller absolute value of tangent approximation) can be selected from θ1 and θ2 as an inclination angle $\theta_{left}$, a smaller inclination angle θ3 (corresponding to a smaller absolute value of tangent approximation) can be selected from θ3 and θ4 as $\theta_{right}$. (A reason why the selecting smaller absolute value of tangent approximation is that σ of the normal distribution of the threshold voltages of the flash memory cell is small, a value of y is more gradually changed closer to a bottom of a valley, a value of y is more steeply changed closer to a peak, and selecting the inclination angle to be close to the bottom of the valley, that is, a gradual change of y, can reducing an error to a greatest extent.)

The present disclosure provides equation (2) to calculate Vopt.

$$Vopt = \frac{V_{left} * \tan\theta_{right} - V_{Right} * \tan\theta_{left}}{\tan\theta_{right} - \tan\theta_{left}} \quad \text{Formula (2)}$$

Alternatively, $\tan\theta_{left}$ and $\tan\theta_{right}$ in the above formula may take absolute values respectively and change subtraction in the formula to addition. If so, the changed formula can be understood as a weighted calculation.

However, in practice, since the curves f12 and f22 are unknown, although they can be modeled by data fitting, this operation takes a lot of time. Thus, in an alternative embodiment, an approximate calculation is used to calculate $\tan\theta_{left}$ and $\tan\theta_{right}$.

Specifically, first, as shown in FIG. 6, the detection voltages V11, V12, V21, V22 are applied to the respective memory cells, and then the numbers n1, n2, n3, and n4 of the respective memory cells whose threshold voltages equal to V11, V12, V21, V22 respectively are counted. Two points (v11, n1) and (v12, n2) on the curve f12 and two points (v21, n3) and (v22, n4) on the curve f22 are finally obtained.

Then approximately calculate $\tan\theta_{left}$ and $\tan\theta_{right}$ by formula (3)

$$\tan\theta_{right} \approx \frac{n2 - n1}{V12 - v11} \quad \text{Formula (3)}$$

$$\tan\theta_{left} \approx \frac{n4 - n3}{V22 - v21}$$

Resultant values obtained by the above formula is then substituted into the formula (2), and substituting V12 in FIG. 6 served as $V_{left}$ and V21 served as $V_{Right}$ into the formula (2) to calculate to obtain Vopt. V12 is a larger value in the two detected voltages for generating the negative tangent approximation, that is, V12 is a horizontal coordinate value of the inclination angle $\theta_{left}$ corresponds to the negative tangent approximation, and V21 is a smaller value in the two detected voltages for generating the positive tangent approximation, that is, V21 is a horizontal coordinate value of the inclination angle $\theta_{right}$ corresponds to the positive tangent approximation.

In an embodiment, methods are provided to obtain Vleft And VRight. For example, a first initial voltage value is selected, and then a first step length is increased step by step based on the first initial value, so as to obtain a plurality of detection voltages required by the above embodiment, or a second initial voltage value is selected, and then a second step length is decreased step by step based on the second initial voltage value, and the first step length and the second step length may be equal or different.

Continue to refer to FIG. 3, the dotted lines f11 and f21 are threshold voltage distribution diagrams (which may be obtained through experiments or provided by manufacturers) under ideal conditions, and in an embodiment, the voltage value corresponding to a peak of f11 may be used as the first initial voltage value, and the voltage value corresponding to a peak of f21 may be used as the second initial voltage value. It is also possible to select a voltage value between the first voltage initial value and the second voltage initial value as a third voltage initial value, and then increase and/or decrease the third step length step by step on the basis of the third voltage initial value to obtain a plurality of detection voltages. A default detection voltage of the memory also may be served as the third voltage initial value. The default reference voltage of the memory is a voltage parameter provided at a time of memory production. Basically, the default reference voltage can be considered as the voltage Vopt at which the number of the electric charges of the respective memory cells has not changed. The default reference voltage may be one or more, only one for SLC memory cell, and two or more for other types of memory cell.

Figure 7:
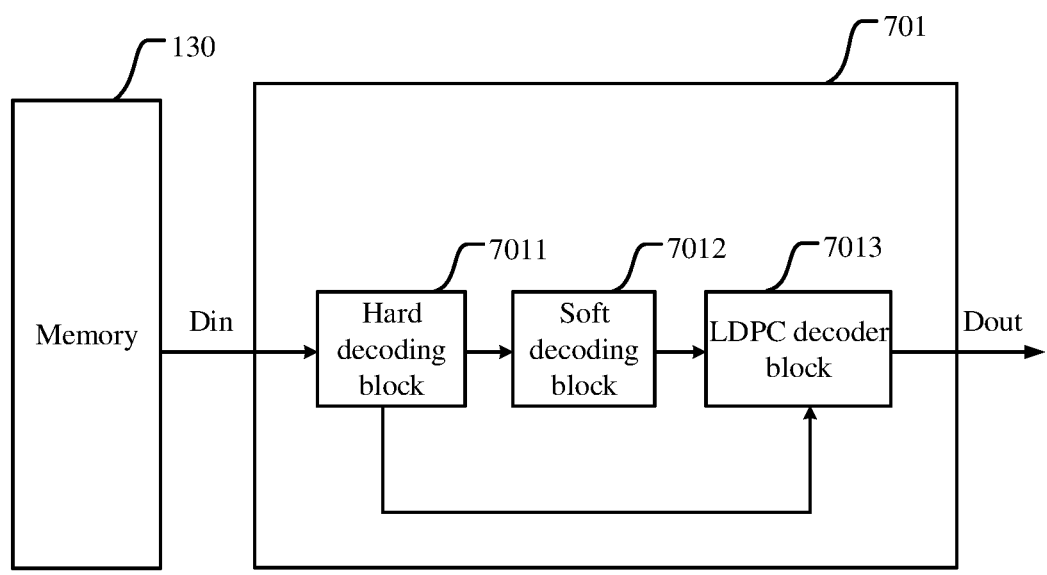
FIG. 7 is a structural diagram of a reading control apparatus of an embodiment of the present disclosure.

FIG. 7 is a structural diagram of the reading control apparatus 701 according to the embodiment of the present disclosure. As shown in the figure, the reading control apparatus 701 includes a hard decoding block 7011, a soft decoding block 7012, and an LDPC decoder block 7013. The hard decoding block 7011 is configured to perform hard decision decoding of the LDPC under the optimal detection voltage to obtain first data. The soft decoding block 7012 is configured to perform soft decision decoding on the first data to obtain second data. The LDPC decoder block 7013 is configured to perform LDPC decoding on the second data to obtain a final output data. In above description with respect to FIG. 2, it is illustrated that the prior art reading control apparatus 121 also includes a soft decoding block 1212 and an LDPC decoder block 1213. The soft decoding block 7012 and the LDPC decoder block 7013 in the present embodiment may be blocks identical to the soft decoding block 1212 and the LDPC decoder block 1213.

However, the hard decoding block 7011 and the hard decoding block 1211 provided in this embodiment are necessarily different. A difference is that the hard decoding block 7011 obtains the optimal detection voltage by following steps. Specifically, the plurality of detection voltages, which are increased sequentially, are applied to the respective memory cells of the memory 130 in a plurality of times, and after each time applying the detection voltage, determining a magnitude relationship between the threshold voltage and the detection voltage of each memory cell by reading a voltage value of each memory cell, and counting the number of the memory cells whose threshold voltage is equal to the detection voltage. Subtracting adjacent detection voltages to obtain a voltage difference value, subtracting the numbers of the memory cells respectively corresponding to the adjacent detection voltages to obtain a number difference value of the memory cells, and dividing the number difference value of the memory cells by the voltage difference value to obtain a tangent approximate value. In this way, the plurality of tangent approximations can be finally obtained. Then, a positive number and a negative number are selected from the plurality of tangent approximations, and preferably, the absolute values of the two numbers are the smallest of all the positive and negative tangent approximations, and then calculating the optimal detection voltage based on the positive and negative numbers and the corresponding detection voltages. The number of the optimal detection voltages is one or more, for example, if the memory cell is SLC, the optimal detection voltage is one, but if the memory cell is TLC, the optimal detection voltage is seven (the memory cell of TLC stores three bits of data).

Further, the plurality of detection voltages may be obtained by uniform movement of a specific step from one voltage initial value. For example, the voltage is increased or decreased step by step by a certain step length on the basis of one voltage initial value to obtain the plurality of detection voltages. For another example, the voltages are increased and decreased in steps on the basis of an initial voltage value to obtain the plurality of detection voltages. The initial voltage values for these three cases are different. The initial voltage value may be determined based on the voltage distribution of the memory, which is described above and will not be described in detail here.

Therefore, the reading control method and the reading control apparatus provided by the embodiment of the disclosure can obviously improve a hard decision capability, and so that improving a data reading capability of the reading control apparatus as a whole.

The term "block" as used herein may refer to, be part of, or include the following: an Application Specific Integrated Circuit (ASIC), an electronic circuit, a processor (shared, dedicated, or group) and/or memory (shared, dedicated, or group) that executes one or more software or firmware programs, a combinational logic circuit, and/or other suitable components that provide the described functionality.

Those skilled in the art will appreciate that the various blocks or units of a data processing system according to the present disclosure may be implemented in hardware, firmware or software. The software includes, for example, a code program formed using various programming languages such as JAVA, C/C++/C #, SQL, and the like. Although the steps and sequence of steps of the embodiments of the present disclosure are presented in method and method diagrams, the executable instructions of the steps implementing the specified logical functions may be re-combined to create new steps. The sequence of the steps should not be limited to the sequence of the steps in the method and the method illustrations, and can be modified at any time according to the functional requirements. Such as performing some of the steps in parallel or in reverse order.

The data processing system and method according to the present disclosure may be deployed on a single or a plurality of servers. For example, different blocks may be deployed on different servers, respectively, to form a dedicated server. Alternatively, the same functional unit, block or system may be deployed in a distributed fashion across a plurality of servers to relieve load stress. The server includes but is not limited to a plurality of PCs, PC servers, blades, supercomputers, etc. on the same local area network and connected via the Internet.

The above are only some embodiments of the present disclosure and are not used to limit the present disclosure. For those skilled in the art, the present disclosure can have various modifications and changes. Any modification, equivalent replacement, improvement, etc. made within the spirit and principle of the present disclosure should be included in the protection scope of the present disclosure.

What is claimed is:

1. An optimal detection voltage obtaining method of memory, comprising:
    performing a plurality of read operations at a plurality of detection voltages to obtain a plurality of first difference values and a plurality of second difference values, wherein the second difference value characterizes a difference value of two detection voltages which are adjacent in numerical value, and the first difference value characterizes a difference between numbers of memory cells whose threshold voltages respectively equal to the two detection voltages used by the second difference value;
    dividing the first difference by the second difference to obtain a plurality of tangent approximations;
    selecting a first tangent approximation and a second tangent approximation from the plurality of tangent approximations, the first tangent approximation is a positive number and the second tangent approximation is a negative number;
    calculating an optimal detection voltage according to the first tangent approximation, the second tangent approximation, a first detection voltage corresponding to the first tangent approximation and a second detection voltage corresponding to the second tangent approximation.

2. The optimal detection voltage obtaining method according to claim 1, wherein the calculating an optimal detection voltage according to the first tangent approximation, the second tangent approximation, a first detection voltage corresponding to the first tangent approximation and a second detection voltage corresponding to the second tangent approximation comprises:
    taking the second tangent approximation as a weight coefficient of the first detection voltage corresponding to the first tangent approximation, and taking the first tangent approximation as a weight coefficient of the second detection voltage corresponding to the second tangent approximation to perform weighting calculation, to obtain the optimal detection voltage.

3. The optimal detection voltage obtaining method according to claim 1, wherein a step of obtaining the plurality of detection voltages is one of:
    increasing a first step length step by step on a basis of a first voltage initial value to obtain the plurality of detection voltages;
    reducing a second step length step by step on a basis of a second voltage initial value to obtain the plurality of detection voltages;
    increasing or decreasing a third step length step by step on a basis of a third voltage initial value to obtain the plurality of detection voltages.

4. The optimal detection voltage obtaining method according to claim 3, wherein the third voltage initial value is a default detection voltage of the memory.

5. The optimal detection voltage obtaining method according to claim 1, wherein an absolute value of the first tangent approximation is equal to an absolute value of the second tangent approximation.

6. The optimal detection voltage obtaining method according to claim 3, further comprising: obtaining a plurality of voltage values corresponding to a plurality of peaks of threshold voltage distribution of the memory in an ideal condition; and taking a voltage value corresponding to the peak as the first initial voltage value or the second initial voltage value.

7. The optimal detection voltage obtaining method according to claim 1, wherein when the memory is a multi-level cell, a trinary-level cell or a quad-level cell, the optimal detection voltage obtaining method further comprises: obtaining a plurality of optimal detection voltages by repeatedly executing respective steps of the optimal detection voltage obtaining method.

8. The optimal detection voltage obtaining method according to claim 1, wherein the first tangent approximation is a minimum value of positive tangent approximations, and the second tangent value is a minimum value of absolute values of negative tangent approximations.

9. A read control method of a memory, comprising:
obtaining the optimal detection voltage by using the optimal detection voltage obtaining method according to any one of claims 2;
performing hard decision decoding of LDPC under the optimal detection voltage to obtain first data;
performing soft decision decoding on the first data to obtain second data;
performing LDPC decoding on the second data to obtain final output data.

10. A read control apparatus of a memory, comprising:
a hard decoding block for performing hard decision decoding of LDPC under the optimal detection voltage to obtain first data;
a soft decoding block for performing soft decision decoding on the first data to obtain second data;
an LDPC decoder block for performing LDPC decoding on the second data to obtain final output data,
wherein an optimal detection voltage obtaining method comprises following steps:
performing a plurality of read operations at a plurality of detection voltages to obtain a plurality of first difference values and a plurality of second difference values, wherein the second difference value characterizes a difference value of two detection voltages which are adjacent in numerical value, and the first difference value characterizes a difference between numbers of memory cells whose threshold voltages respectively equal to the two detection voltages used by the second difference value;
dividing the first difference by the second difference to obtain a plurality of tangent approximations;
selecting a first tangent approximation and a second tangent approximation from the plurality of tangent approximations, the first tangent approximation is a positive number and the second tangent approximation is a negative number;
calculating an optimal detection voltage according to the first tangent approximation, the second tangent approximation, a first detection voltage corresponding to the first tangent approximation and a second detection voltage corresponding to the second tangent approximation.

11. The read control apparatus according to claim 10, wherein the calculating an optimal detection voltage according to the first tangent approximation, the second tangent approximation, a first detection voltage corresponding to the first tangent approximation and a second detection voltage corresponding to the second tangent approximation comprises:
taking the second tangent approximation as a weight coefficient of the first detection voltage corresponding to the first tangent approximation, and taking the first tangent approximation as a weight coefficient of the second detection voltage corresponding to the second tangent approximation to perform weighting calculation, to obtain the optimal detection voltage.

12. The read control apparatus according to claim 10, wherein a step of obtaining the plurality of detection voltages is one of:
increasing a first step length step by step on a basis of a first voltage initial value to obtain the plurality of detection voltages;
reducing a second step length step by step on a basis of a second voltage initial value to obtain the plurality of detection voltages;
increasing or decreasing a third step length step by step on a basis of a third voltage initial value to obtain the plurality of detection voltages.

13. The read control apparatus according to claim 12, wherein the third voltage initial value is a default detection voltage of the memory.

14. The read control apparatus of claim 10, wherein an absolute value of the first tangent approximation is equal to an absolute value of the second tangent approximation.

15. The read control apparatus according to claim 12, wherein a step of obtaining the first initial voltage value and second initial voltage value comprises: obtaining a plurality of voltage values corresponding to a plurality of peaks of threshold voltage distribution of the memory in an ideal condition; and taking a voltage value corresponding to the peak as the first initial voltage value or the second initial voltage value.

16. The read control apparatus according to claim 10, wherein the first tangent approximation is a minimum value of positive tangent approximations, and the second tangent value is a minimum value of absolute values of negative tangent approximations.

17. The read control apparatus of any of claim 11, wherein the memory is a flash memory.

* * * * *